(12) United States Patent
Kusyk et al.

(10) Patent No.: US 6,510,056 B1
(45) Date of Patent: Jan. 21, 2003

(54) HINGED REMOVABLE CONNECTOR MODULE

(75) Inventors: Richard G. Kusyk, Ottawa (CA);
Richard G. Murphy, Kanata (CA);
Bruce Irwin Dolan, Kanata (CA);
Craig Donald Suitor, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/671,252

(22) Filed: Sep. 28, 2000

(51) Int. Cl.[7] .............................. H05K 7/00; H05K 7/14
(52) U.S. Cl. ........................ 361/752; 361/730; 361/796; 361/797; 439/62; 211/41.17
(58) Field of Search ................................. 361/730, 752, 361/753, 796, 797, 788, 732, 740, 759, 801; 439/61, 62; 211/41.17

(56) References Cited

U.S. PATENT DOCUMENTS 4,501,368 A * 2/1985 Gill .......................... 211/41.17
5,769,644 A     6/1998 Murphy et al. ............... 439/61

* cited by examiner

Primary Examiner—Jayprakash N. Gandhi

(57) ABSTRACT

The present invention is directed to a shelf for housing PCPs. A backplane extends across the shelf. A connector module having the OAM&P connectors is electrically connected to the backplane and has two positions. In one position it extends sideways from the shelf with the connectors in a front to rear direction. In the second position, the OAM&P connector module is substantially flush with the side of the shelf.

23 Claims, 4 Drawing Sheets

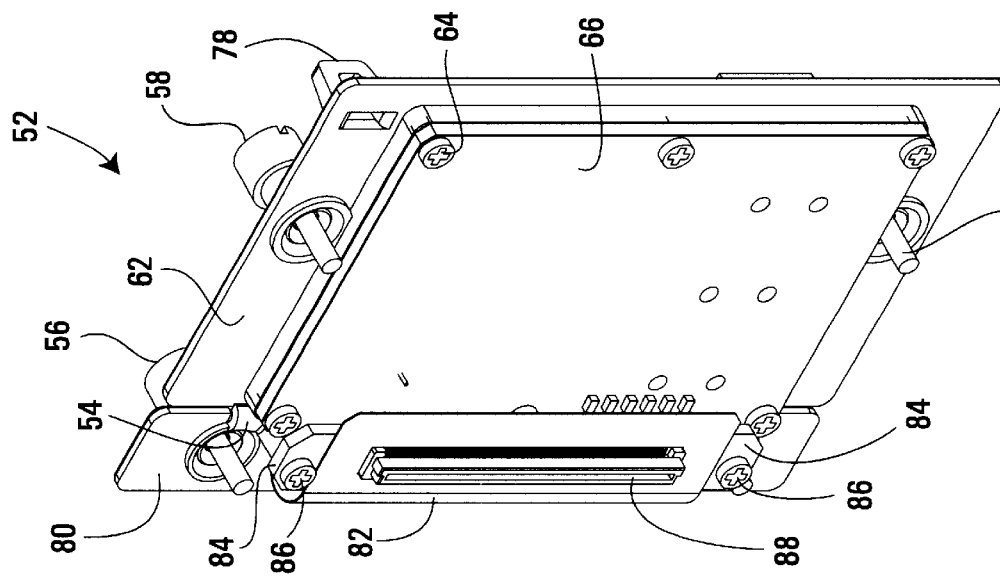
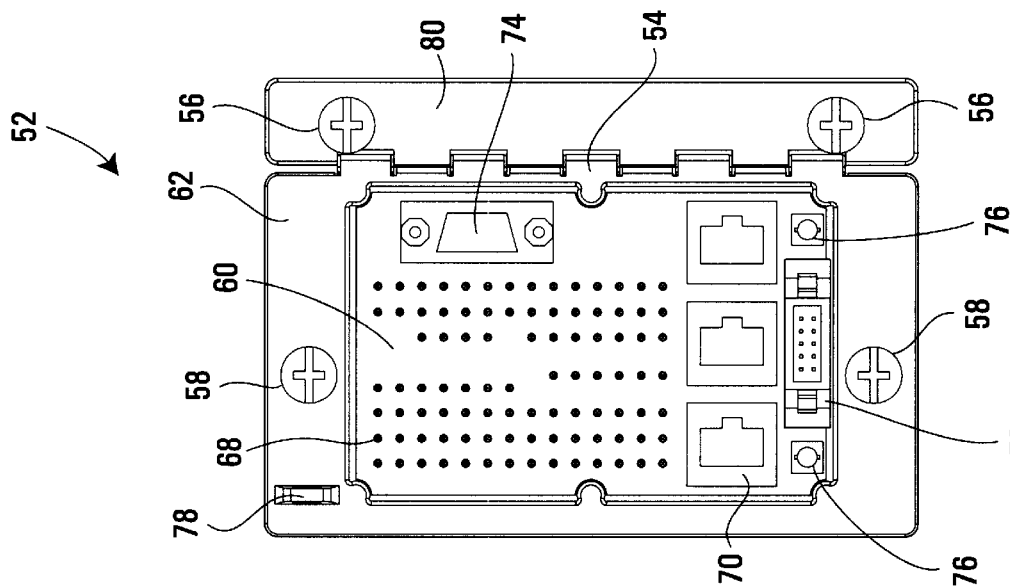
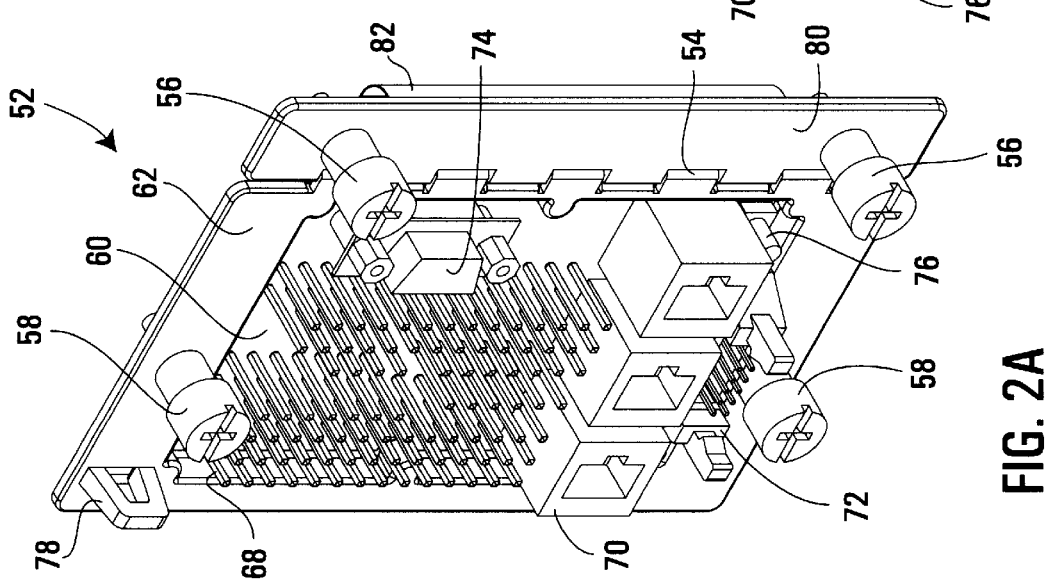

HINGED REMOVABLE CONNECTOR MODULE

FIELD OF THE INVENTION

This invention relates generally to shelves for housing printed circuit packs (PCPs) and more particularly to the provision of connections for operation, administration, maintenance and provisioning functions.

BACKGROUND OF THE INVENTION

Shelves for housing PCPs face significant space restrictions. This is particularly so for shelves located in a central office of a telephone switching service provider. The space available is dictated by the height, width and depth of the racks which a service provider uses for holding the shelves. It is important to minimize the space occupied by any component of a system.

A shelf typically has a printed circuit board (PCB) extending across the rear, referred to as a backplane, which has a series of connectors on its front face. Alternatively, the backplane may be placed more forwardly in the shelf and have a series of connectors on both its front and rear face. In such cases, the backplane may be referred to as a midplane. PCPs are oriented perpendicular to the backplane and plugged into the connectors on the backplane. These connectors generally have a super set of pins to match a large number of connection configurations so that a variety of different PCPs may alternatively be plugged into the same position in the backplane.

I/O connections for,carrying input and output signals to the PCPs within the shelf and connections for the control of the shelf, namely the operation, administration, maintenance and provisioning (OAM&P) of the shelf itself, are also usually made through the backplane. The type of cable connectors required for the I/O of the PCPs will vary depending on the PCPs connected to the shelf. In contrast, the number and type of connectors required for the OAM&P of a shelf supplied by a particular service provider is normally fixed.

For both I/O and OAM&P, typically a fixed pattern of cable connectors is mounted on the back surface of the backplane. Although a fixed pattern is acceptable from the OAM&P perspective, there are several disadvantages to this mode of enabling cable connections for the OAM&P of the shelf. First, access to the cable connectors is only available from the rear of the backplane. Second, the mounting of the cable connectors on the rear of the backplane means that the backplane must sit sufficiently forward in the rack to accommodate their presence. This limits the usable depth of rack and, by extension, the width of the PCPs which may be plugged into the backplane. Third, placing the cable connectors on the rear of the backplane prevents the backplane from being used in the midplane configuration. Forth, if there were a fault found with one of the OAM&P connectors, the entire backplane would need to be replaced.

One solution which has been proposed by Murphy et al. is described in U.S. Pat. No. 5,769,644. In that solution, both the I/O connections for the PCPs in the shelf and the connections for the OAM&P are done through a module which extends outward from the side of the shelf. This module can be exchanged with other connector modules where a change in the PCPs in the shelf necessitates a change in the I/O connectors. This removes the cable connectors from the rear of the backplane and allows more flexibility to change PCPs without needing to change the backplane. However, because the OAM&P connectors are on the same module, the change in the I/O connectors also results in an unnecessary change in the OAM&P connectors. Also, the module is in a fixed position relative to the shelf.

SUMMARY OF THE INVENTION

The present invention is directed to an improved shelf for housing PCPs. A backplane extends across the shelf. A connector module having the OAM&P connectors is electrically connected to the backplane and has two positions. In one position it extends sideways from the shelf with the connectors facing either forward or backward, depending on the user's preference. This allows the user front or rear access for connection to the connectors of the module. In the second position, the OAM&P connector module is substantially flush with the side of the shelf. This position allows the OAM&P module to be tucked out of the way to minimize the space used by the OAM&P module and allow access to what is behind it along the side of the shelf.

Advantageously, the OAM&P functionality is on a separate module which may be changed or left unchanged irrespective of any changes made to other connectors in the system.

Also advantageously, if used in conjunction with a system that removes the I/O connectors from the backplane, the backplane may sit more rearwardly in the shelf, and thus the size, and consequently the functionality, of the PCPs which connect into the backplane may be increased. Alternatively, the backplane may be used in a midplane configuration.

Further, the dual positioning allows for easy access to connect to the connectors of the OAM&P module while allowing the OAM&P module to be tucked out of the way when new connections are not being made.

BRIEF DESCRIPTION OF THE DRAWINGS

Preferred embodiments of the invention will now be described with reference to the attached drawings in which:

FIGS. 2A 2B and 2C respectively depict an isometric front view, a front view, and an isometric rear view of an OAM&P connector module in accordance with an embodiment of the present invention;

DETAILED DESCRIPTION OF THE EMBODIMENT

Figure 1:
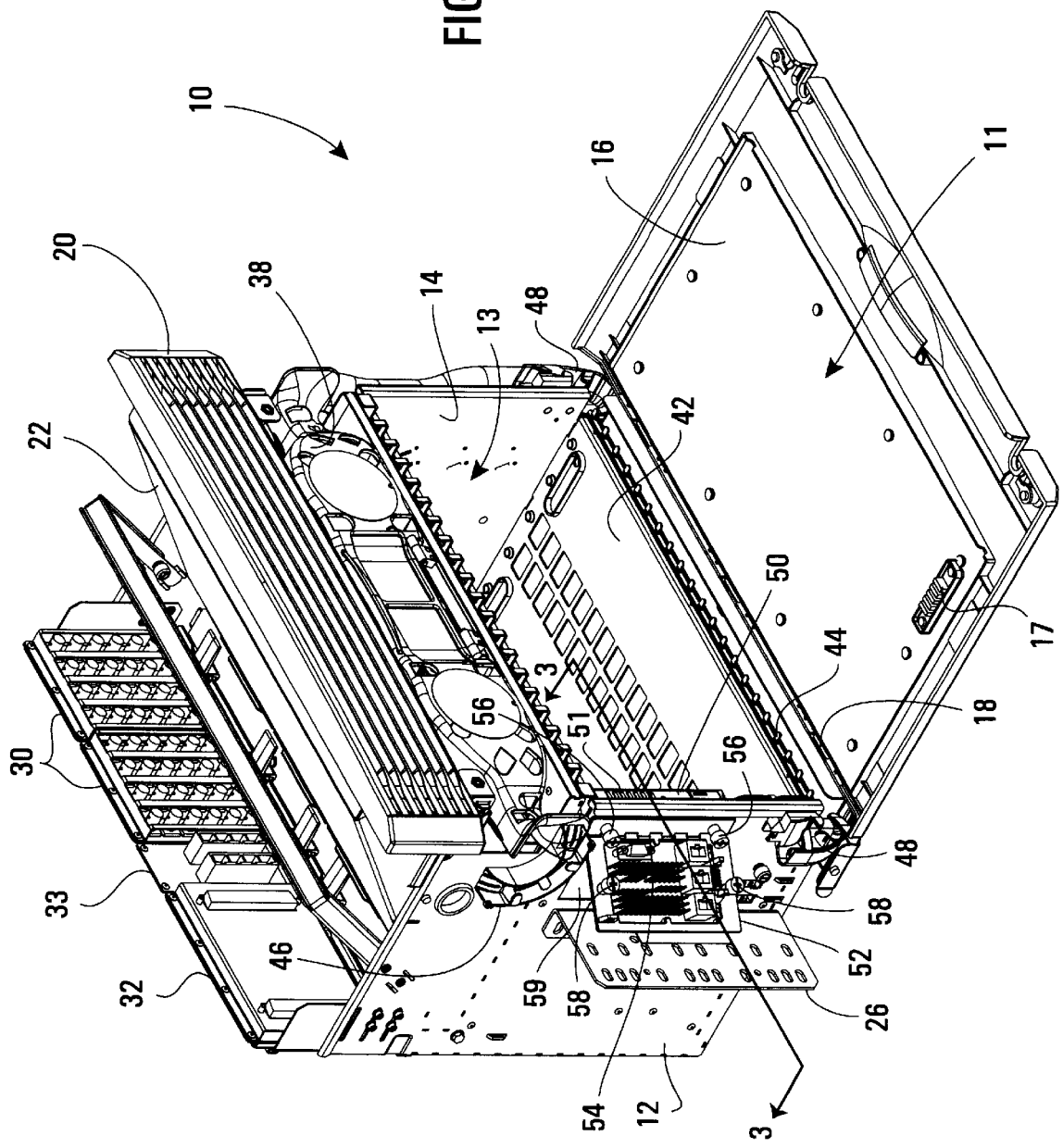
FIG. 1 depicts an isometric view of a shelf for housing PCPs in accordance with an embodiment of the present invention.

FIG. 1 shows a shelf 10 for housing PCPs, which may be part of a telephone switching-system. It has an.open front 11 with a left side panel 12 and a right side panel 14 extending along the sides of the open front from a rear to a front of the shelf 10 to define a shelf space 13. A front cover 16 provides electromagnetic interference (EMI) protection to the otherwise open shelf 10. The front cover 16 is hinged to the shelf 10 at a lower end by hinges 18. An air vent 20 is attached to the shelf 10 above the front cover 16. The air vent 20 has openings defined therethrough which allows airflow from the interior of the shelf 10 when the front cover 16 is in the closed position (i.e. rotated upward to cover the open front 11). An air deflector 22 deflects. air which exits the shelf 10 after travelling upwards through the shelf 10.

At the front of the shelf 10 is a fiber guide 38. Also utilized for the positioning of fiber are a fiber bracket 44, fiber guides 46 and fiber guides 48. At the rear of the top of the shelf 10 are I/O connector modules. The examples of such modules depicted in FIG. 1 are coaxial cable connector modules 30, an RJ45 connector module 33 and a champ connector module 32.

In the interior of the shelf 10 is a lower cross member 42 which, along with a similar upper cross member (not shown), is used to create a plurality of side-by-side receiving stations which guide PCPs into and hold PCPs within the shelf 10. Positioned in the left most of these receiving stations is a backplane extender card 50. The backplane extender card 50 is a printed circuit board and has a plurality of visual indicators 51, typically light emitting diodes, which indicate the status of some of the OAM&P functions of the shelf 10. A plurality of lenses 17 in the front cover 16 allow the status of the visual indicators 51 to be seen when the front cover 16 is in the closed position.

Mounted on the left side panel 12 and the right side panel 14 are mounting brackets 26. The mounting bracket on the right side panel 14 cannot be seen in FIG. 1. The mounting brackets 26 are used to mount the shelf 10 into a rack of a service provider. On an exterior face of the left side panel 12 and forwardly of the mounting bracket 26 is an OAM&P module 52 in accordance with the present invention. The OAM&P module 52 is electrically connected to the backplane extender card 50 through a hole 59 in the left side panel 12. In FIG. 1, the OAM&P module 52 is shown to be partially rotated forward on a hinge 54 such that it extends sideways from the left side panel 12 of the shelf 10. This substantially forward facing position is the first of two relative positions in which the OAM&P module is positioned for operation. A pair of screws 56 are used to secure the OAM&P module 52 to the left side panel 12 and are normally secured to the left side panel 12. A second pair of screws 58 are fastened to the left side panel 12 only when the OAM&P module 52 is secured flush against the left side panel 12. When the OAM&P module 52 is rotated forwardly, as shown in FIG. 1, the pair of screws 58 are not engaged with the left side panel 12. Other means, other than a hinge, may be used to move between the first position and the second position.

The details of the OAM&P module 52 can be seen in FIGS. 2A through 2C. The OAM&P module 52 is comprised of a PCB 60 held in a frame 62. The PCB 60 is sandwiched between the frame 62 and a plexi-glass plate 66 and held in place by a plurality of screws 64.

On the front face of the PCB 60 are connectors used for the OAM&P functionality of the OAM&P module 52. Specifically, there are a plurality of wire bonding posts 68. The plexi-glass plate 66 is present to protect the installer's hands when holding the OAM&P module 52 during wire wrapping on the wire bonding posts 68. There are also three RJ45 connectors 70, a fan connector 72, a TBOS (Telemetry Byte Oriented Serial) D-Sub connector 74, and two input timing reference interface connectors 76. Although this collection of connectors are described in the present embodiment, any set of OAM&P connectors which are required by a service provider may be used.

Also present on the frame 62 is a wire bonding strain relief post 78. Wires which are wire wrapped around the wire bonding posts 68 are first threaded through the wire bonding strain relief post 78 to reduce strain on the wire wrap connections.

The frame 62 is connected by the hinge 54 to a securing plate 80. The screws 56 are held by the securing plate 80 while screws 58 are held by the frame 62. Extending from a side of the PCB 60 adjacent the securing plate 80, is a flexible extension 82. The PCB 60 and the flexible extension (flexi-cable) 82 may typically be comprised of copper electrical traces held within a resin structure. The flexible extension 82 is held against the securing plate 80 by a plate 84 held in place by a pair of screws 86. The flexible extension 82 is folded around such that the front of a connector 88 which is connected to the flexible extension 82 is rear facing. The connector 88 is used to electrically connect the OAM&P module 52 to the backplane extender card 50 (not shown in this figure).

Figure 3:
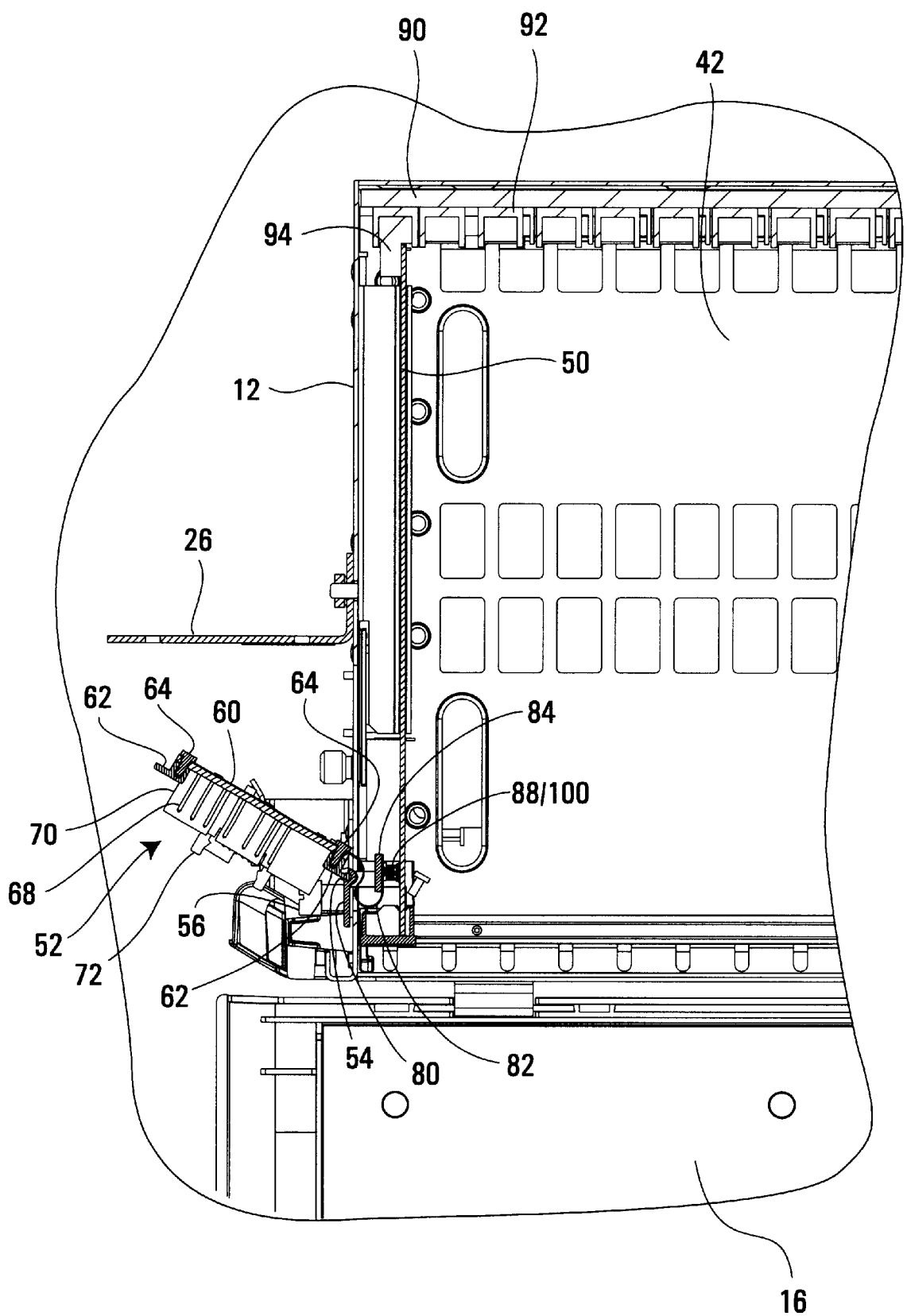
FIG. 3 depicts a partial cross-sectional view through line 3—3 of FIG. 1.

FIG. 3 shows how the flexible extension 82 and the connector 88 electrically connect the OAM&P module 52 to the backplane extender card 50.

At the rear of the lower cross member 42 is located a backplane 90. Attached to a front face of the backplane 90 are a plurality of edge connectors 92. Inserted into the left most of the edge connectors 92 is an edge connector 94. The edge connector 94 is electrically and mechanically connected to the backplane extender card 50. The edge connector 92 and the edge connector 94 are adapted to mate and electrically connect the backplane extender card 50 to the backplane 90. The backplane extender card 50 extends forwardly substantially perpendicular to the backplane 90 to a point forward of mounting bracket 26.

Also situated forwardly of the mounting bracket 26 and rearwardly of the front cover 16 is the OAM&P module 52. Top views of the wire bonding posts 68 and the connectors 70 and 72 are visible in FIG. 3. The PCB 60 is held against the frame 62 by the screws 64. At the edge of the OAM&P module 52 closest to the left side panel 12, the hinge 54 connects to the securing plate 80. The securing plate 80 is connected to left side panel 12 by the screws 56. The flexible extension 82 extends through the left side panel 12 and is held against the securing plate 80 by the plate 84. The flexible extension 82 is electrically connected to the backplane extender card 50 by the mating of the connector 88 on the flexible extension 82 and a connector 100 on the left face of the backplane extender 50. Thus the wire bonding posts 68 and the connectors 70, 72, 74 (not shown in this figure), and 76 (not shown in this figure) are electrically connected to the backplane 90 through the PCB 60, the flexible extension 82, the connector 88, the connector 100, the backplane extender card 50, the edge connector 94 and the left most of the edge connectors 92. The OAM&P module 52 may be removed and replaced by disconnecting the connector 88 from the connector 100 and unscrewing the screws 56 and the screws 58, if secured, from the left side panel 12.

The flexible extension 82 permits the rotation of the OAM&P module 52 to be accommodated without interfering with the electrical connection between the OAM&P module 52 and the shelf 10. In particular, the flexible extension 82 is both flexible enough and long enough to maintain the electrical connection throughout the rotation of the OAM&P module 52 from a position flush against the left side panel 12 to a position where the OAM&P module 52 extends sideways from the left side panel 12.

Although the backplane extender card 50 is used in the present embodiment, the backplane extender card 50 may be eliminated where the flexible extension 82 is designed to be long enough to reach the backplane 90 directly and the connector 88 is adapted to connect to the left most of edge connectors 92.

Additionally, although the present embodiment is directed to the use of a backplane at the rear of the shelf, the backplane may alternatively be used in a midplane configuration at an intermediate location in the shelf. In such a configuration, the backplane extender card may either extend forwardly or rearwardly.

The position of the OAM&P module 52 depicted in the FIGS. 1 and 3, namely the OAM&P module 52 being positioned to be forward facing and including other positions where the OAM&P module is rotated further forward, is the positioning normally used for making connections to the OAM&P module 52. Although the present embodiment depicts the OAM&P module 52 as being forward facing, the OAM&P module 52 could also be designed to be rearward facing.

Figure 4:
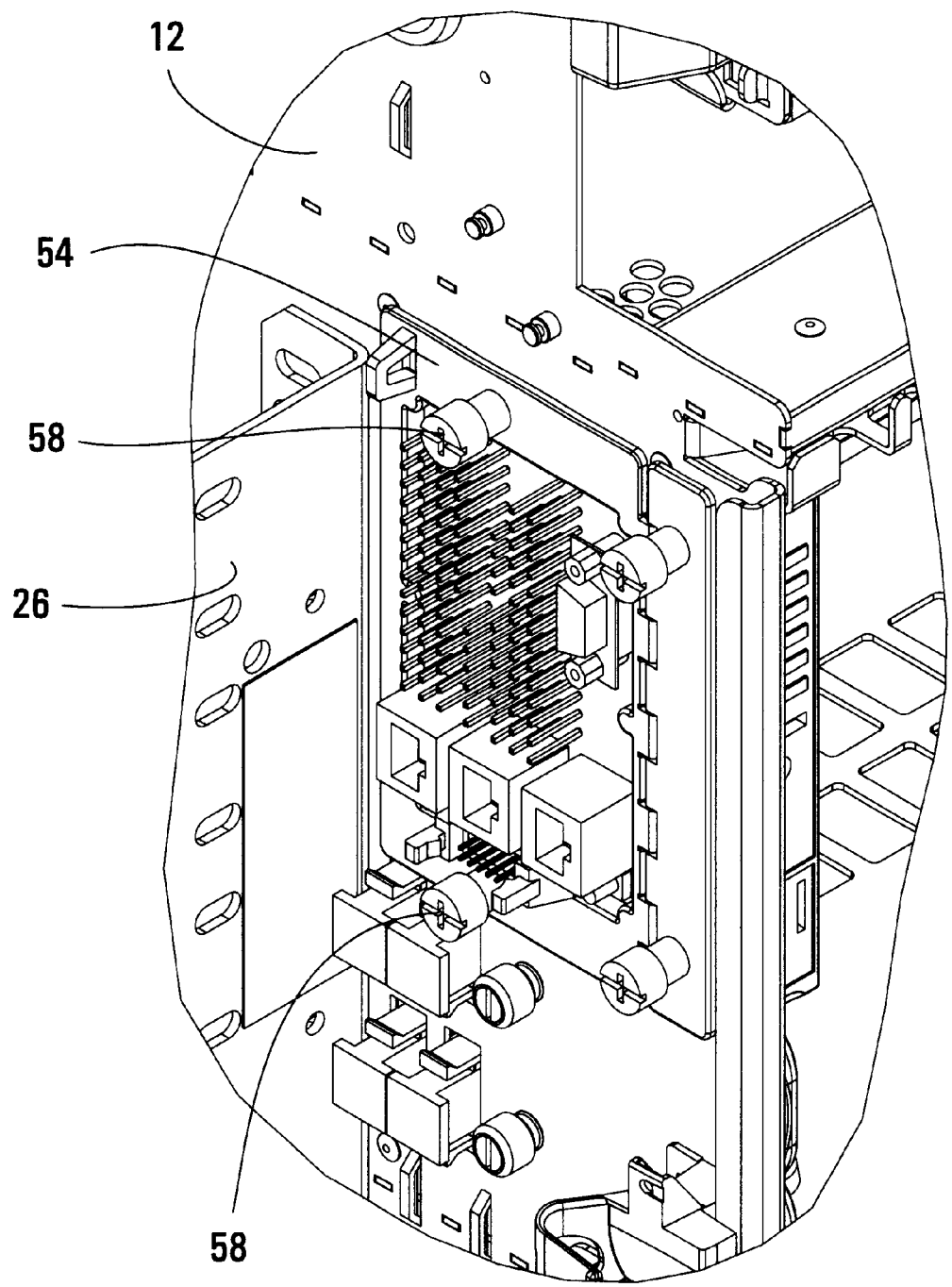
FIG. 4 depicts an enlarged partial isometric view of the OAM&P module positioned flush against the left side of the shelf in accordance with an embodiment of the present invention.

In FIG. 4 the OAM&P module 52 is depicted in the second position in which it is intended to be used. The OAM&P module 52 is positioned flush against the left side panel 12 and the screws 58 are engaged with the left side panel 12 to hold the OAM&P module 52 against the left side panel 12. This positioning is used when it is desirable to move the OAM&P module 52 out of the way. In the present embodiment, this position allows access to the mounting bracket 26. However, in other embodiments, other components may be rearward of the OAM&P module 52.

Other than the PCBs and the connectors, the components of shelf 10 are generally of a steel alloy construction.

The above description of embodiments should not be interpreted in any limiting manner since variations and refinements can be made without departing from the spirit of the invention. The scope of the invention is defined by the appended claims and their equivalents.

What is claimed is:

1. A shelf for housing printed circuit packs comprising:
    an open front;
    a first side and a second side extending from a rear to the open front of the shelf, the first side and the second side being spaced apart at opposite ends of a shelf space;
    a backplane extending across the shelf;
    a plurality of side-by-side receiving stations located in the shelf space for printed circuit packs to be received through the open front for connection to the backplane; and
    a connector module having a plurality of connectors, the connector module being electrically connected to the backplane and mechanically connected to the first side;
    the connector module having a first position wherein the connector module extends sideways away from the housing and the connectors extend in a substantially front to rear direction of the shelf;
    the connector module having a second position wherein the connector module extends substantially along the first side of the shelf;
    the connector module being movable between the first position and the second position.

2. The shelf of claim 1 further comprising:
    at least one backplane extender printed circuit board electrically connected to the backplane and extending adjacent the first side of the shelf; and
    the connector module being electrically connected to the backplane through the backplane extender printed circuit board.

3. The shelf of claim 1 wherein the connector module is movable between the first position and the second position by the use of a hinge.

4. The shelf of claim 1 wherein the connectors face forward for frontal access in the first position.

5. The shelf of claim 1 wherein the connectors face rearward for rear access in the first position.

6. The shelf of claim 1 wherein the connectors are for the control functions of the shelf.

7. The shelf of claim 6 wherein the connectors are for operation, administration, maintenance, and provisioning of the shelf.

8. The shelf of claim 1 wherein the connector module is movable through a range of positions between the first position and the second position.

9. The shelf of claim 1 wherein the connector module comprises a printed circuit board having a plurality of connectors mounted thereon.

10. The shelf of claim 2 wherein the connector module comprises a printed circuit board having a plurality of connectors mounted thereon.

11. The shelf of claim 10 wherein the printed circuit board has a flexible extension extending therefrom which connects to the backplane extender card through an opening defined in the first side of the shelf, the flexible extension permitting movement of the connector module between the first position and the second position without interfering with the electrical connection between the connector module and the shelf.

12. The shelf of claim 11 wherein the backplane extender printed circuit board has an edge connector which mates with a front facing connector on the backplane and the backplane extender printed circuit board has a second connector which mates with a connector on the flexible extension of the connector module.

13. A removable connector module adapted for connection to a shelf for housing printed circuits packs comprising:
    a printed circuit board;
    a plurality of connectors mechanically and electrically connected to the printed circuit board and extending substantially perpendicular to the printed circuit board;
    a hinge mechanically connected to the printed circuit board; and
    a flexible extension from the printed circuit board, the flexible extension being adapted to electrically connect to a shelf for housing printed circuit boards;
    the hinge being adapted to rotatably connect to a side of the shelf such that the connector module may be rotated to extends sideways from the shelf or to extend along a side of the shelf, the flexible extension permitting rotation of the connector module to be accommodated without interfering with the electrical connection between the connector module and the shelf.

14. The connector module of claim 13 wherein the flexible extension has an electrical connector which faces oppositely to the plurality of connectors, the electrical connector being adapted to electrically connect to a backplane extender printed circuit board extending along a side of the shelf.

15. The connector module of claim 13 further comprising a screw means adapted to fasten the module to the shelf, the screw means not interfering with the rotation of the module around the hinge.

16. The connector module of claim 15 further comprising a second screw means adapted to fasten the module to the shelf when the module is flush against the shelf, the second screw means preventing the module from rotating around the hinge when the second screw means has fastened the module to the shelf.

17. The connector module of claim 13 wherein a plexiglass plate is attached at a rear of the printed circuit board.

18. The connector module of claim 16 wherein the printed circuit board is held within a frame.

19. The connector module of claim 18 wherein the screw means is comprised of screws held within the frame.

20. The connector module of claim 18 wherein the hinge connects the frame to a plate and the second screw means is comprised of screws held within the plate.

21. A backplane and connector module assembly for use with a shelf for housing printed circuit packs comprising:

a backplane;

a connector module;

the connector module having a plurality of connectors;

the connector module being movable between two positions wherein, in a first one of the two positions, the connectors extend substantially perpendicular to the backplane and the connector module is electrically and mechanically connected to the backplane and, in a second one of the two positions, the connectors extend substantially parallel to the backplane and the connector module is electrically and mechanically connected to the backplane.

22. The backplane and connector module assembly of claim 21 wherein:

the connector module has a flexible extension which is adapted to electrically connect the connector module to the backplane and to permit rotation of the connector module to be accommodated without interfering with the electrical connection between the connector module and the shelf.

23. The backplane and connector module assembly of claim 21 further comprising:

at least one backplane extender printed circuit board electrically connected to the backplane and extending substantially perpendicular to the backplane;

the connector module being electrically connected to the backplane through the backplane extender printed circuit board.

* * * * *